US006844140B1

(12) United States Patent
Wertz et al.

(10) Patent No.: US 6,844,140 B1
(45) Date of Patent: Jan. 18, 2005

(54) METHOD FOR REDUCING START UP BLINDING IN NO-PROCESS LITHOGRAPHIC PRINTING PLATES

(75) Inventors: Scott Alan Wertz, Greeley, CO (US); Paul R. West, Fort Collins, CO (US); Nicki R. Miller, Fort Collins, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/747,643

(22) Filed: Dec. 29, 2003

(51) Int. Cl.[7] ........................... G03F 7/038; G03F 7/26; B41M 5/00; B41M 5/26; B41F 1/18

(52) U.S. Cl. ....................... 430/302; 430/303; 430/309; 430/964; 101/451; 101/467

(58) Field of Search ................................ 430/302, 303, 430/309, 964; 101/451, 467

(56) References Cited

U.S. PATENT DOCUMENTS

| | | | |
|---|---|---|---|
| 5,713,287 A | | 2/1998 | Gelbart |
| 6,365,705 B1 | | 4/2002 | Leon |
| 6,447,978 B1 | | 9/2002 | Leon et al. |
| 2002/0142247 A1 | * | 10/2002 | Kawamura et al. ...... 430/270.1 |

* cited by examiner

*Primary Examiner*—Richard L. Schilling
(74) *Attorney, Agent, or Firm*—RatnerPrestia

(57) ABSTRACT

A method for reducing start up blinding in no-process lithographic printing plates is disclosed. An imageable element, comprising an imageable layer over a substrate, is thermally imaged. The imageable layer comprises a thermally sensitive polymer that comprises quaternary ammonium salts of carboxylic acids. Following imaging, the surface of the imaged imageable is contacted with an aqueous solution comprising 0.05 wt % to about 5 wt % of an added organic acid having a pKa of about 1 to about 6. This reduces the amount of waste produced by the printing process by reducing the number of unusable sheets produced during the "make ready" process.

20 Claims, No Drawings

METHOD FOR REDUCING START UP BLINDING IN NO-PROCESS LITHOGRAPHIC PRINTING PLATES

FIELD OF THE INVENTION

The invention relates to lithographic printing. In particular, this invention relates to a method for reducing start up blinding in no-process lithographic printing plates.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically the ink is first transferred to an intermediate blanket, which in turn transfers the ink to the surface of the material upon which the image is to be reproduced.

Imageable elements useful as lithographic printing plate precursors typically comprise an imageable layer applied over the hydrophilic surface of a substrate. The imageable layer includes one or more radiation-sensitive components, which may be dispersed in a suitable binder. Alternatively, the radiation-sensitive component can also be the binder material.

Conventionally, imaging of the imageable element with ultraviolet and/or visible radiation is carried out through a mask, which has clear and opaque regions. However, direct digital imaging, which obviates the need for imaging through a mask, is becoming increasingly important in the printing industry. Imageable elements have been developed for use with infrared lasers. These imageable elements typically require processing in a developer to convert them to lithographic printing plates. Developers are typically aqueous alkaline solutions, which may also contain substantial amounts of organic solvents. Because of their high pH and the presence of organic solvents, disposal of substantial quantities of developer is expensive and can cause environmental problems. Processing of the imaged imageable element in a developer also introduces additional costs in, for example, the cost of the developer, the cost of the processing equipment, and the cost of operating the process.

To overcome these disadvantages, imageable elements that do not require processing in a developer have been developed. One approach is the use of elements in which the imageable layer comprises a "switchable polymer." During thermal imaging, these polymers typically undergo a chemical reaction in which highly polar moieties are either created or destroyed so that the surface of the imageable layer is changed from oleophilic to hydrophilic or from hydrophilic to oleophilic. No only do these imageable elements not require processing in a developer, they can be imaged on-press, which eliminates the step of mounting the element in a separate imaging device.

Leon, U.S. Pat. No. 6,447,978, the disclosure of which is incorporated herein by reference, discloses an imageable element comprising a support having a hydrophilic imageable layer. The imageable layer comprises a hydrophilic heat-sensitive polymer that contains quaternary ammonium carboxylate groups. When the imageable layer is thermally imaged, the imaged regions are rendered more oleophilic than the unimaged regions. However, the resulting printing plates show start up blinding on press. That is, it can take several hundred impressions before good quality prints of good, uniform density are produced. Thus a need exists for a method for forming an image using a no-process imageable element useful as a printing plate precursor that does not have this problem.

SUMMARY OF THE INVENTION

The invention is a method for forming an image. The method comprises, in order, the steps of:

a) thermally imaging an imageable element, the imageable layer comprising an imageable layer over a substrate, and forming imaged regions and complementary unimaged regions in the imageable layer, in which:

the imageable layer comprises a thermally sensitive polymer that comprises quaternary ammonium salts of carboxylic acids; and the imaged regions of the imageable layer are more oleophilic and less hydrophilic than the unimaged regions of the imageable layer;

b) contacting the imageable layer with an aqueous solution comprising about 0.05 wt % to about 5 wt % of an added organic acid having a pKa of about 1 to about 6;

c) contacting the imageable layer with ink; and d) transferring the ink to a receiving material and forming the image.

This method reduces the amount of waste produced by the printing process by reducing the number of unusable sheets produced during the "make ready" process.

In one aspect of the invention, the imageable layer comprises a photothermal conversion material. In another aspect of the invention, the aqueous solution is a fountain solution. In still another aspect of the invention, steps c) and d) are repeated, in order, as many times as required to produce the desired number of copies of the image.

DETAILED DESCRIPTION OF THE INVENTION

Unless otherwise indicated, the terms thermally sensitive polymer, organic acid, photothermal conversion material, coating solvent, and similar terms also include mixtures of such materials. Thermal imaging refers to imaging with a hot body, such as a thermal head, or with infrared radiation. Unless otherwise specified, all percentages are percentages by weight.

Imaging and Processing

The imageable element, which is described below, may be thermally imaged with a laser or an array of lasers emitting modulated near infrared or infrared radiation in a wavelength region that is absorbed by the imageable element. Imaging causes the imaged regions of the imageable layer to become more oleophilic and less hydrophilic than the unimaged regions of the imageable layer. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Suitable commercially available imaging devices include image setters such as the CREO® Trendsetter (Creo, Burnaby, British Columbia, Canada); the Screen PlateRite model 4300, model 8600, and model 8800 (Screen, Rolling Meadows, Chicago, Ill., USA); and the Gerber Crescent 42T (Gerber Systems, South Windsor, Conn., USA).

For on-press imaging, the imageable element is imaged while mounted on a lithographic printing press cylinder, and the imaged imageable element is contacted with fountain solution comprising the added organic acid during the initial press operation. This is especially suitable for computer-to-press application in which the imageable element (or elements, for multiple color presses) is directly imaged on the plate cylinder according to computer generated digital imaging information and, with minimum or no treatment, directly prints out regular printed sheets. On-press imaging may be carried out on, for example, a Quickmaster DI 46-4 press (Heidelberger Drückmaschinen, Heidelberg, Germany).

Alternatively, the imageable element may be thermally imaged using a hot body, such as a conventional apparatus containing a thermal printing head. A suitable apparatus includes at least one thermal head but would usually include a thermal head array, such as a TDK Model No. LV5416 used in thermal fax machines and sublimation printers, the GS618-400 thermal plotter (Oyo Instruments, Houston, Tex., USA), or the Model VP-3500 thermal printer (Seikosha America, Mahwah, N.J., USA).

Background sensitivity is the term used to describe printing in the non-image areas and results when the non-image areas of the printing plate are insufficiently hydrophilic (i.e., too oleophobic). Start-up blinding refers to the situation in which no ink or an insufficient amount of ink transfers to the paper corresponding to the image areas on the plate during the initial phase of the printing process. Start-up blinding occurs when the plate image areas are insufficiently oleophilic.

After imaging, the imaged imageable element is contacted with an aqueous solution comprising an added organic acid. If the added organic acid is too strong and/or the concentration of the added organic acid is too high, the resulting printing plate will show background sensitivity. It the added organic acid is too weak and/or the concentration is too low, the printing plate will show startup blinding.

The solution contains an effective amount of the added organic acid. The aqueous solution contains about 0.05 wt % to about 5 wt % of the added organic acid, typically about 0.1 wt % to about 4 wt % of the added organic acid, more typically about 0.15 wt % to about 3 wt % of the added organic acid. Concentrations in the range of about 0.2 wt % to about 3 wt %, about 0.25 wt % to about 3 wt %, and about 0.3 wt % to about 3 wt % may also be used. The optimal concentration, or concentration range, for a particular added organic acid may be determined by routine experimentation.

The concentration refers to the amount of the acid added ("added organic acid"). When water is used to prepare an acid wash, the concentration refers to the amount of organic acid added, which will correspond to the concentration of the acid in the water. When fountain solution is used, the concentration refers to the amount of organic acid added to the fountain solution.

When organic acid is added to a fountain solution that contains an organic acid, the final concentration of organic acid in the fountain solution will be higher than the concentration of the added organic acid. However, the total amount of organic acid in the fountain solution after addition of the added organic acid (added organic acid plus organic acid present in the fountain solution) will typically be 0.05 wt % to about 5 wt %, more typically about 0.1 wt % to about 4 wt %.

The added organic acid typically has a pKa of about 1 to about 6, more typically about 1.1 to 5. For polycarboxylic organic acids, such as citric acid, this pKa is the pKa of the first ionization, i.e., pKa1. The organic acid must have adequate solubility in water to achieve the effective concentration. Useful added organic acids include, for example, formic acid, acetic acid, acrylic acid, propionic acid, butyric acid, isobutyric acid, methacrylic acid, glycolic acid, diglycolic acid, lactic acid, oxalic acid, malonic acid, succinic acid, citric acid, malic acid, tartaric acid, maleic acid, fumaric acid, glyoxylic acid, pyruvic acid, mandelic acid, hydroxybutyric acid, glyceric acid, gluconic acid, and mixtures thereof.

The added organic acid may be applied as an acid wash, either before or after the imaged imageable element is mounted in the printing press. The acid wash is a solution of added organic acid in water. Although distilled or deionized water may be used, the acid wash typically can be prepared using tap water. The acid wash may be applied by wiping the plate with a cloth or sponge, by spraying the plate or by dipping the plate in the solution of the added organic acid. Alternatively, the added organic acid may be included in the fountain solution.

Imageable Element

The imageable element comprises an imageable layer over a substrate. These elements are disclosed in Leon, U.S. Pat. No. 6,447,978, the disclosure of which is incorporated herein by reference.

The imageable layer comprises a thermally sensitive polymer that becomes more oleophilic and less hydrophilic when heated, i.e., a "switchable polymer." The thermally sensitive polymer comprises quaternary ammonium salts of carboxylic acids. The polymer typically has a molecular weight of at least 3,000 Daltons and preferably of at least 20,000 Daltons.

The polymer comprises one or more types of carboxylate-containing units, indicated as "A" the structure below, and optionally one or more non-carboxylated units, indicated as "B" in the structure below.

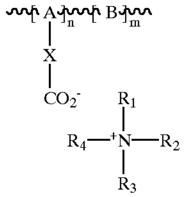

The carboxylate groups may be bonded directly to the polymer backbone (i.e., —X— is a single bond), they may be connected to the polymer backbone by a spacer group (i.e. X is a spacer group), or both.

When present, the spacer group can be any divalent aliphatic, alicyclic or aromatic group that does not adversely affect the polymers heat-sensitivity. For example, the spacer group can be a substituted or unsubstituted alkylene group having 1 to 10 carbon atoms, such as $(—CH_2—)_n$, in which n is 1 to 10, typically 1 to 4, such as methylene, ethylene, n-propylene, or n-butylene); isopropylene, 2,2,-dimethylpropylene; substituted or unsubstituted arylene group having 6 to 10 carbon atoms in the arylene ring, such as o-, m- or p-phenylene or 1,4-, 2,7-, or 1–8-naphthylene. The spacer group may also comprise an carbonamido, oxy, thio, amido, oxycarbonyl, aminocarbonyl, alkoxycarbonyl, alkanoyloxy, alkanoylamino or alkaminocarbonyl group, such as, for example, $—C(O)—OCH_2CH_2OC(O)—CH_2CH_2—$; $—C(O)—OCH_2CH_2OC(O)\text{-o-}C_6H_4—$; $—C(O)—NH\text{-p-}C_6H_4—$; and $—C(O)—OCH_2CH_2—NH\text{-p-}C_6H_4—$.

Optionally, one or more non-carboxylate containing monomers that provide the units represented by B may be included in the polymer. Any useful hydrophilic or oleophilic monomer that provides desired physical or printing properties of the surface imageable layer may be used.

The thermally sensitive polymer may be chosen or derived from a variety of polymers and copolymer classes such as, for example, polyesters, polyamides, polyurethanes, and polymers and copolymers based on ethylenically unsaturated polymerizable monomers. Numerous ways of preparing the thermally polymers will be apparent to those skilled in the art. Many quaternary ammonium salts and carboxylic acid or anhydride-containing polymers are commercially available. Others can be readily synthesized using well known preparative techniques, such as free radical polymerization. An addition polymer may be prepared by, for example, free radical polymerization, and converted to the carboxylate containing polymer by reaction with, for example, a quaternary ammonium hydroxide.

Free radical polymerization is well known to those skilled in the art and is described, for example, in Chapters 20 and 21, of *Macromolecules*, Vol. 2, 2nd Ed., H. G. Elias, Plenum, N.Y., 1984. Useful free radical initiators are peroxides such as benzoyl peroxide, hydroperoxides such as cumyl hydroperoxide and azo compounds such as 2,2'-azobis (isobutyronitrile) (AIBN). Chain transfer agents, such as dodecyl mercaptan, may be used to control the molecular weight of the binder. Suitable solvents include liquids that are inert to the reactants and which will not otherwise adversely affect the reaction. Typical solvents include, for example, esters such as ethyl acetate and butyl acetate; ketones such as methyl ethyl ketone, methyl isobutyl ketone, methyl propyl ketone, and acetone; alcohols such as methanol, ethanol, isopropyl alcohol, and butanol; ethers such as dioxane and tetrahydrofuran, and mixtures thereof.

Preferably, the polymer is an addition polymer or copolymer containing, in polymerized form, acrylic acid, methacrylic acid, maleic acid or anhydride, itaconic acid or anhydride, and/or a conjugate base or hydrolysis product thereof. Other, optional, monomers include for example, olefins such as butadiene, isoprene, propylene, and ethylene; acrylate and methacrylate esters, such as methyl acrylate and methacrylate, ethyl acrylate and methacrylate, butyl acrylate and methacrylate, t-butyl acrylate and methacrylate, 2-hydroxyethyl methacrylate, 2-hydroxypropyl methacrylate, 2-ethoxyethyl acrylate and methacrylate, 2-(2-ethoxyethoxy)ethyl acrylate and methacrylate, 2-ethylhexyl acrylate and methacrylate, octyl acrylate and methacrylate, lauryl acrylate and methacrylate, 2-phenoxyethyl acrylate and methacrylate, benzyl acrylate and methacrylate, isobornyl acrylate and methacrylate, phenyl acrylate and methacrylate, 2-phenylethyl acrylate and methacrylate, and tetrahydrofurfuryl acrylate and methacrylate; acrylamides and methacrylamides, such as acryl and methacrylamide; vinyl ethers, such as methyl vinyl ether; vinyl esters, vinyl acetate; acrylonitrile: methacrylonitrile; and styrene and substituted styrenes. Alternatively, a polymer that contains a hydroxyl groups, such a polymer that contains, in polymerized form, a hydroxyl containing monomer, such as 2-hydroxyethyl methacrylate, or a hydrolyzed vinyl ester polymer, such as a polyvinyl alcohol or a vinyl alcohol copolymer, can be converted to a carboxylic acid containing polymer by reaction with, for example, a cyclic anhydride such as, for example, succinic anhydride or phthalic anhydride.

Carboxylic acid or anhydride-containing polymers can be converted to the desired quaternary ammonium carboxylate salts by a variety of methods such as: 1) reaction of a carboxylic acid- or acid anhydride-containing polymer with the hydroxide salt of the desired quaternary ammonium ion; 2) ion exchange resin; 3) dialysis; 4) addition of a salt of a volatile acid of the desired quaternary ammonium ion, such as an acetate or formate salt, to the carboxylic acid-containing polymer followed by drying; 5) electrochemical ion exchange; 6) polymerization of monomers containing the desired quaternary ammonium carboxylate units; and 7) combination of a specific salt of the carboxylic acid-containing polymer and a specific quaternary ammonium salt, both chosen such that the undesired counterions will form an insoluble ionic compound in a chosen solvent and precipitate.

The thermally sensitive polymer comprises about 25 mol % to 100 mol %, preferably from about 50 mol % to 100 mol % of the monomer that contains the carboxylate group and 0 to about 75 mol %, preferably 0 to about 50 mol % of other monomer or monomers. Typically, the heat-sensitive polymer contains a minimum of one mole of the quaternary ammonium carboxylate groups per 1300 g of polymer and a maximum of one mole of quaternary ammonium carboxylate groups per 132 g of polymer. Preferably, this ratio (moles of quaternary ammonium carboxylate groups to grams of polymer) is from about 1:600 to about 1:132 and more preferably, this ratio is from about 1:500 to about 1:132. This parameter is readily calculated from the molecular formula of the polymer.

The quaternary ammonium cation may be any ammonium ion in which the nitrogen is covalently bound to a total of four alkyl or aryl substituents. $R_1$, $R_2$, $R_3$, and $R_4$ are each independently substituted or unsubstituted alkyl groups having 1 to 12 carbon atoms, such as methyl, ethyl, n-propyl, isopropyl, t-butyl, hexyl, 2-hydroxyethyl, 3-hydroxyropyl, 2-ethylxyethoxy, benzyl, substituted benzyl, such as 4-methoxybenzyl, o-bromobenzyl, and p-trifluoromethylbenzyl, and cyanoalkyl, or substituted or unsubstituted aryl groups having 6 to 14 carbon atoms in the carbocyclic ring, such as phenyl, naphthyl, xylyl, p-methoxyphenyl, p-methylphenyl, m-methoxyphenyl, p-chlorophenyl, p-methylthiophenyl, p-N,N-dimethylaminophenyl, methoxycarbonylphenyl and cyanophenyl. Alternatively, any two, three or four of $R_1$, $R_2$, $R_3$, and $R_4$ may be combined to form one of more rings with the quaternary nitrogen atom, the ring or rings having 5 to 14 carbon, oxygen, sulfur and nitrogen atoms in the ring, such as morpholine, piperidine, pyrrolidine, carbazole, indoline and isoindoline rings. The nitrogen atom can also be located at the tertiary position of the fused ring. Other useful substituents for these various groups are readily apparent to one skilled in the art. Alternatively, multi-cationic ionic species containing more than one quaternary ammonium unit covalently bonded together and having charges greater than +1 (for example +2 for diammonium ions, and +3 for triammonium ions) may be used.

Preferably, the nitrogen of the quaternary ammonium ion is directly bonded to one or more benzyl groups or one or two phenyl groups. Spiro ammonium cations in which the nitrogen lies at the vertex of two intersecting rings, may be used. These polymers are disclosed in Leon, U.S. Pat. No. 6,365,705, the disclosure of which is incorporated herein by reference. When these polymers are used, the cation may be:

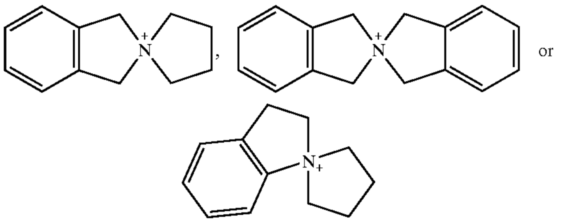

When a polymer containing such a cation is thermally imaged, low molecular weight amines are not given off and the problem of odor during imaging is alleviated. Similarly, the benzyl-tris-hydroxyethyl ammonium ion produces triethanolamine, which is odorless.

Although it is preferred that all of the carboxylic acid groups of the polymer are converted to the desired quaternary ammonium salt, imaging compositions in which the polymer is incompletely converted may also be satisfactory. Preferably, at least 50 monomer percent of the carboxylic acid (or equivalent anhydride) containing monomers are converted to quaternary ammonium groups.

The thermally sensitive polymer may be cross-linked. Crosslinking may be provided in a number of ways well-known to those skilled in the art. Ethylenically unsaturated polymerizable monomers having crosslinkable groups (or groups that can serve as attachment points for crosslinking additives) can be copolymerized with the other monomers as noted above. Such monomers include, but are not limited to, 3-(trimethylsilyl)propyl acrylate or methacrylate, cinnamoyl acrylate or methacrylate, N-methoxymethyl methacrylamide, N-aminopropylmethacrylamide hydrochloride, acrylic or methacrylic acid and hydroxyethyl methacrylate. Crosslinking can be provided by the addition of an epoxy-containing resin to the quaternary ammonium carboxylate polymer or by the reaction of a bisvinylsulfonyl compound with amine containing units, such as N-aminopropylmethacrylamide, within the polymer. CR-5L, an epoxide resin from Esprix Technologies, may be used for this purpose.

The imageable layer may comprise one or more of additional homopolymers or copolymers, up to about 50 wt % of the layer, based on dry weight of the imageable layer, provided that the additional polymer or polymers do not adversely affect the properties of the imageable layer necessary for imaging.

The imageable layer may comprise an infrared absorber, known as a photothermal conversion material. Photothermal conversion materials absorb radiation and convert it to heat. Although a photothermal conversion material is not necessary for imaging with a hot body, imageable elements that contain a photothermal conversion material may also be imaged with a hot body, such as a thermal head or an array of thermal heads.

The photothermal conversion material may be any material that can absorb radiation and convert it to heat. Suitable materials include, for example, dyes and pigments. Suitable pigments include, for example, carbon black, Heliogen Green, Nigrosine Base, iron (III) oxide, manganese oxide, Prussian Blue, and Paris blue. The size of the pigment particles should not be more than the thickness of the layer that contains the pigment. Preferably, the size of the particles will be half the thickness of the layer or less.

Because of its low cost and wide absorption bands that allow it to be used with imaging devices having a wide range of peak emission wavelengths, one useful pigment is carbon black. Carbon blacks that are surface-functionalized with solubilizing groups are well known. Carbon blacks are grafted to hydrophilic, nonionic polymers, such as FX-GE-003 (Nippon Shokubai), or which are surface-functionalized with anionic groups, such as CAB-O-JET® 200 or CAB-O-JET® 300 (Cabot Corp.), are preferred carbon blacks.

The photothermal conversion material may be a dye with the appropriate absorption spectrum. Dyes, especially dyes with a high extinction coefficient in the range of 750 nm to 1200 nm, are preferred. Examples of suitable dyes include dyes of the following classes: methine, polymethine, arylmethine, cyanine, hemicyanine, streptocyanine, squarylium, pyrylium, oxonol, naphthoquinone, anthraquinone, porphyrin, azo, croconium, triarylamine, thiazolium, indolium, oxazolium, indocyanine, indotricarbocyanine, oxatricarbocyanine, phthalocyanine, thiocyanine, thiatricarbocyanine, merocyanine, cryptocyanine, naphthalocyanine, polyaniline, polythiophene, chalcogenopyryloarylidene and bis (chalcogenopyrylo)polymethine, polypyrrole, oxyindolizine, pyrazoline azo, and oxazine classes. Absorbing dyes are disclosed in numerous publications, for example, Nagasaka, EP 0,823,327; DeBoer, U.S. Pat. No. 4,973,572; Jandrue, U.S. Pat. No. 5,244,771; and Chapman, U.S. Pat. No. 5,401,618. Examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectralR 830A and SpectralR 840A (Spectra Colors), and IR Dye A, whose structure is shown below:

IR Dye A

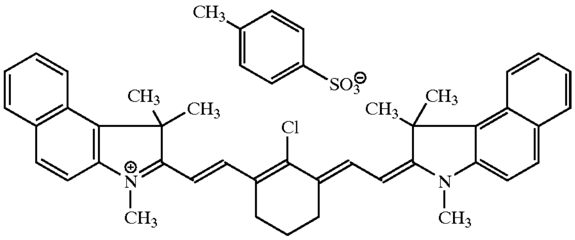

The imageable layer may also comprise one or more ingredients that are conventional components of imageable layers, provided that do not adversely affect the properties of the imageable layer. These include, for example, surfactants and dyes or colorants to allow visualization of the image.

The imageable layer typically comprises at least 0.1 g/m$^2$, and preferably from about 0.1 g/m$^2$ about 10 g/m$^2$ of the thermally sensitive polymer based on the dry weight of the imageable layer. This generally provides a thickness of from about 0.1 $\mu$m to about 10 $\mu$m. The photothermal conversion material(s) are generally present in an amount sufficient to provide an optical density of at least 0.3, preferably of at least 0.5, and more preferably of at least 1.0, at the operating wavelength of the imaging laser. As is well known to those skilled in the art, the amount of compound required to produce a particular optical density can be determined from the thickness of the layer in which it is present and the extinction coefficient of the infrared absorber at the wavelength used for imaging using Beer's law. Alternatively, a photothermal conversion material can be included in a separate layer that is in thermal contact with the imageable layer.

The imageable composition may be coated over a variety of substrates. The substrate comprises a support, which may be any material conventionally used to prepare imageable elements useful as lithographic printing plates. The substrate is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

The thickness of the support can be varied. In most applications, the thickness should be sufficient to sustain the wear from printing and thin enough to wrap around a printing form. A polyester support prepared from, for example, polyethylene terephthalate or polyethylene naphthalate, typically a thickness of from about 100 $\mu$m to about 310 $\mu$m. Aluminum foil typically has a thickness of from about 100 $\mu$m to about 600 $\mu$m.

The substrate may comprise an interlayer between the aluminum support and the imageable layer. The interlayer may be formed by treatment of the support with, for example, silicate, dextrine, hexafluorosilicic acid, phosphate/fluoride, polyvinyl phosphonic acid, vinyl phosphonic acid copolymers, or a water-soluble diazo resin.

The back side of the substrate (i.e., the side opposite the imageable layer) may be coated with an antistatic agent and/or a slipping layer or matte layer to improve handling and "feel" of the imageable element. Typically, the imageable layer has a coating weight of about 0.5 to about 4 g/m$^2$, preferably 0.8 to 3 g/m$^2$.

The support can also be a cylindrical surface having the imageable layer thereon, and thus being an integral part of a printing press. The use of imaged cylinders is described in, for example, Gelbart, U.S. Pat. No. 5,713,287.

The imageable element may be prepared by applying the imageable layer over the hydrophilic surface of the substrate using conventional techniques. The imageable layer may be applied by any conventional method, such as coating or lamination. Typically the ingredients of the imageable layer are dispersed or dissolved in a suitable coating solvent, such as water or a mixture of water and an organic solvent such as methanol, ethanol, iso-propyl alcohol, and/or acetone, and the resulting mixture coated by conventional methods, such as spin coating, bar coating, gravure coating, die coating, slot coating, or roller coating. After coating, the layer is dried to remove the coating solvent. The resulting element may be air dried at ambient temperature or at an elevated temperature, such as at about 65° C. for about 20 seconds in an oven. Alternatively, the resulting imageable element may be dried by blowing warm air over the element. The composition can also be applied by spraying onto a suitable support, such as an on-press printing cylinder, as described in Gelbart, U.S. Pat. No. 5,713,287.

INDUSTRIAL APPLICABILITY

Once the imageable element has been imaged and developed to form a lithographic printing plate, printing can then be carried out by contacting the imageable layer a fountain solution and then with ink. Numerous aqueous fountain solutions are known to those skilled in the art. Fountain solutions are disclosed, for example, in Matsumoto, U.S. Pat. No. 5,720,800; Archer, U.S. Pat. No. 5,523,194; Chase, U.S. Pat. No. 5,279,648; Bondurant, U.S. Pat. Nos. 5,268,025, 5,336,302, and 5,382,298; Egberg, U.S. Pat. No. 4,865,646; and Daugherty, U.S. Pat. No. 4,604,952.

The fountain solution is taken up by the non-imaged regions, i.e., the more hydrophilic and less oleophilic regions of the imageable layer, and the ink is taken up by the imaged regions, i.e., the less hydrophilic and more oleophilic regions of the imageable layer. The ink is then transferred to a suitable receiving material (such as cloth, paper, metal, glass or plastic) either directly or indirectly using an offset printing blanket to provide a desired impression of the image thereon. These steps may be repeated, in order, as many times as desired, until the desired number of copies of the image, at least 10, at least 50, at least 100, at least 500, at least 1000, etc., have been produced.

The advantageous properties of this invention can be observed by reference to the following examples, which illustrate but do not limit the invention.

EXAMPLES

In the Examples, "coating solution" refers to the mixture of solvent or solvents and additives coated, even though some of the additives may be in suspension rather than in solution. Except where indicated, the indicated percentages are percentages by weight.

| Glossary | |
|---|---|
| CAB-O-JET ® 200 | Surface sulfonated carbon black (Cabot, Boston, MA, USA) |
| CR-5L | Water-soluble aliphatic epoxide (Esprix Technologies, Sarasota, FL, USA) |
| CREO ® Trendsetter 3230 | Commercially available platesetter, using Procom Plus software, operating at a wavelength of 830 nm (Creo Products Inc., of Burnaby, BC, Canada) |
| GANTREZ ® AN 139 | Methyl vinyl ether/maleic anhydride copolymer (International Specialty Products, Wayne, NJ, USA) |
| LODYNE ® 103A | Fluorosurfactant, (Ciba Specialty Chemicals, Tarrytown, NY, USA) |
| RHEOLATE ® 1 | Aqueous acrylic emulsion (Elementis Specialties, Hightstown, NJ, USA) |

Examples 1 and 2 and Comparative Example 1

A coating solution was prepared as shown in Table 1.

TABLE 1

| Ingredient | Parts by Weight |
|---|---|
| 25% aqueous poly(acrylic acid) | 3.038 |
| 40% aqueous benzyltrimethylammonium hydroxide | 4.406 |
| RHEOLATE ® 1 | 0.420 |
| CAB-O-JET ® 200 | 3.783 |
| CR-5L | 0.252 |
| LODYNE ® 103A | 0.008 |
| n-propanol | 9.634 |
| water | 78.459 |

The coating solution was coated onto grained anodized aluminum. The resulting imageable elements were dried under air currents at about 68° C. (155° F.). The dry coating weight of the imageable layer was 1.6 g/m$^2$. The imageable elements were imaged at 830 nm on a CREO® 3230 Trendsetter at a laser power of 15 W and a drum speed of 100 rpm, corresponding to an imaging energy of 400 mJ/cm$^2$.

The resulting imaged imageable element was mounted on an AB Dick 9870 duplicator press (A. B. Dick, Niles, Ill., USA). The press was charged Van Son Rubber Base black Ink (Van Son Ink, Mineola, N.Y., USA). The aqueous fountain solution contained about 23.5 ml/L (3 oz per gallon) Varn Litho Etch142W (Varn International, Addison, Ill., USA), and about 23.5 ml/L (3 oz per gallon) Varn PAR (alcohol substitute) in water. This fountain solution had a pH of 4.

One third of the imaged imageable layer was wetted with 0.01% (0.0017 M) aqueous acetic acid (pKa about 4.76) (Comparative Example 1). Another third was wetted with 0.1% (0.017 M) aqueous acetic acid, (Example 1). The remainder was wetted with 1% (0.17 M) aqueous acetic acid (Example 2). Reverse osmosis water was used to prepare the aqueous acetic acid, but tap water could have been used.

The plate cylinder was put in contact with the form rollers for 25 revolutions before feeding paper. The imaged regions treated with 1% acetic acid printed at density greater than 1.2 from the first sheet. The imaged regions treated with 0.1% acetic acid achieved a print density of 0.9 after 50 sheets and 1.2 after 75 sheets. The imaged regions treated with 0.01% acetic acid achieved a print density of 0.6 after 75 sheets.

Comparative Example 2

An imageable element was prepared, imaged and mounted on a duplicator press described in Example 1. The imaged imageable layer was wetted with the fountain solution prior to commencement of printing using the procedure described above. After 50 impressions the print density was 0.5. After 100 impressions, the print density was above 1.2.

Example 3

An imageable element was prepared, imaged and mounted on a duplicator press as described in Example 1. One third of the coating was wetted with a 1% (0.17 M) solution of acetic acid, one third with a 5% (0.83 M) solution of acetic acid and the remainder with a 10% (1.7 M) solution of acetic acid. Printing was conducted as described in the preceding examples. All three images were printing an image density of greater than 1.2 after only 5 sheets. The 5% and 10% acetic acid treated areas had some background sensitivity.

Example 4

An imageable element was prepared, imaged and mounted on a duplicator press as described in Example 1. One third of the coating was wetted with 0.25% aqueous acetic acid, another third with 0.25% aqueous glycolic acid (pKa about 3.8) and the remainder with 0.25% aqueous citric acid (pka1 about 3.1). Printing was conducted as described in the preceding examples and after 50 sheets the print densities were 1.2, 0.7, and 0.9, for the three image areas, respectively.

Examples 5–8 and Comparative Examples 3 and 4

An imageable element was prepared, imaged and mounted on a duplicator press as described in Example 1. One sixth of the coating was wetted with a 1% aqueous solution of acetic acid (Example 5), another sixth with 1% aqueous citric acid (Example 6), another sixth with 1% aqueous maleic acid (pka1 about 1.8) (Example 7), another with 1% aqueous oxalic acid (pKa1 about 1.2) (Example 8), another with 1% aqueous sulfuric acid (pKa1 greater than 1) (Comparative Example 3) and the remainder with a 1% aqueous solution of diethylene glycol (pKa about 18) (Comparative Example 4). Printing was conducted as described in the preceding examples. In this test the background was also printing at the start, but cleaned up after 20–25 impressions. After 25 sheets, all the images were printing at a density of 1 or higher, except for the diethylene glycol treated images, which had a print density of only 0.1. The sulfuric acid treated background still exhibited sensitivity after 150 impressions.

Examples 9–12

Coating solutions containing the ingredients listed in Table 2 were prepared. The ingredients are given in parts by weight.

TABLE 2

| Ingredient | Example 9 | Example 10 | Example 11 | Example 12 |
|---|---|---|---|---|
| GANTREZ ® AN-139 | 0.698 | 0.516 | — | — |
| 25% aqueous poly-(acrylic acid) | — | — | 2.457 | 1.785 |
| 40% aqueous benzyl-trimethylammonium hydroxide | 3.354 | — | 3.564 | — |
| 20% aqueous benzyl-tris-(hydroxyethyl) ammonium hydroxide | — | 7.621 | — | 7.968 |
| RHEOLATE ® 1 | 3.075 | 3.075 | 3.075 | 3.075 |
| CAB-O-JET ® 200 | 0.204 | 0.204 | 0.204 | 0.204 |
| CR-5L | 0.340 | 0.340 | 0.340 | 0.340 |
| LODYNE ® 103A | 0.003 | 0.003 | 0.003 | 0.003 |
| n-propanol | 7.692 | 3.607 | 9.704 | 3.329 |
| water | 84.634 | 84.634 | 80.653 | 83.296 |

The compositions were coated as described in Example 1. The resulting imageable elements were imaged on a CREO® 3230 Trendsetter at 114 rpm/15 W (350 mJ/cm$^2$). Strips of the resulting imaged imageable elements were cut and mounted on the A.B. Dick 9870 duplicator press and all four elements were evaluated simultaneously.

The imaged imageable elements were wet with a 1% solution of acetic acid and printing was conducted as described in Example 1. After 15 impressions, the imaged imageable element of Example 8 achieved a print density of 0.8. After 15 impressions, the imaged imageable element of Examples 9, 10, and 11 each had a print density of 1.6.

Example 13

An imageable element was prepared, imaged, and mounted on a duplicator press as described in Example 1. Acetic acid was added in the amount of 1% to the Varn 142W/PAR fountain solution. The coating was wetted with the fountain solution prior to commencement of printing using the same procedure as in Example 1. After only 10 impressions the print density was greater 1.2.

Having described the invention, we now claim the following and their equivalents.

What is claimed is:

1. A method for forming an image, the method comprising, in order, the steps of:

a) thermally imaging an imageable element, the imageable layer comprising an imageable layer over a substrate, and forming imaged regions and complementary unimaged regions in the imageable layer, in which:

the imageable layer comprises a thermally sensitive polymer that comprises quaternary ammonium salts of carboxylic acids; and the imaged regions of the imageable layer are more oleophilic and less hydrophilic than the unimaged regions of the imageable layer;

b) contacting the imageable layer with an aqueous solution comprising about 0.05 wt % to about 5 wt % of an added organic acid having a pKa of about 1 to about 6;

c) contacting the imageable layer with ink; and d) transferring the ink to a receiving material and forming the image.

2. The method of claim 1 in which steps c) and d) are repeated, in order, at least 50 times.

3. The method of claim 1 in which the imageable layer additionally comprises a photothermal conversion material.

4. The method of claim 3 in which thermal imaging is carried out with infrared radiation.

5. The method of claim 4 in which the aqueous solution comprises about 0.1 wt % to about 4 wt % of the added organic acid.

6. The method of claim 5 in which the added organic acid has a pKa of 1.1 to 5.

7. The method of claim 6 in which step b) is carried out on press.

8. The method of claim 1 in which the aqueous solution is a fountain solution.

9. The method of claim 8 in which the total concentration of organic acid in the fountain solution is about 0.05 wt % to about 5 wt %.

10. The method of claim 9 in which the total concentration of organic acid in the fountain solution is about 0.1 wt % to about 4 wt %.

11. The method of claim 10 in which steps c) and d) are repeated, in order, at least 50 times.

12. The method of claim 11 in which the added organic acid is selected from the group consisting of formic acid, acetic acid, acrylic acid, propionic acid, butyric acid, isobutyric acid, methacrylic acid, glycolic acid, diglycolic acid, lactic acid, oxalic acid, malonic acid, succinic acid, citric acid, malic acid, tartaric acid, maleic acid, fumaric acid, glyoxylic acid, pyruvic acid, mandelic acid, hydroxybutyric acid, glyceric acid, gluconic acid, and mixtures thereof.

13. The method of claim 1 in which the aqueous solution is a solution of the added organic acid in water and in step c) the imageable layer is contacted with the ink and with a fountain solution.

14. The method of claim 13 in which steps c) and d) are repeated, in order, at least 50 times.

15. The method of claim 14 in which the added organic acid is selected from the group consisting of formic acid, acetic acid, acrylic acid, propionic acid, butyric acid, isobutyric acid, methacrylic acid, glycolic acid, diglycolic acid, lactic acid, oxalic acid, malonic acid, succinic acid, citric acid, malic acid, tartaric acid, maleic acid, fumaric acid, glyoxylic acid, pyruvic acid, mandelic acid, hydroxybutyric acid, glyceric acid, gluconic acid, and mixtures thereof.

16. The method of claim 15 in which the aqueous solution comprises about 0.1 wt % to about 4 wt % of the added organic acid.

17. The method of claim 1 in which the aqueous solution comprises about 0.1 wt % to about 4 wt % of the added organic acid.

18. The method of claim 1 in which the aqueous solution comprises about 0.15 wt % to about 3 wt % of the added organic acid.

19. The method of claim 1 in which:

the imageable layer additionally comprises a photothermal conversion material;

thermal imaging is carried out with infrared radiation;

the aqueous solution comprises about 0.1 wt % to about 4 wt % of the added organic acid;

the added organic acid has a pKa of 1.1 to 5; and steps c) and d) are repeated, in order, at least 50 times.

20. The method of claim 19 in which steps a) and b) are carried out on press, and the aqueous solution is a fountain solution.

* * * * *